United States Patent
Ho et al.

(10) Patent No.: US 11,443,825 B2
(45) Date of Patent: Sep. 13, 2022

(54) FAILURE MODE ANALYSIS METHOD FOR MEMORY DEVICE

(71) Applicant: Winbond Electronics Corp., Taichung (TW)

(72) Inventors: Yu-Feng Ho, Taichung (TW); Kuo-Min Liao, Taichung (TW); Yu-Pei Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 28 days.

(21) Appl. No.: 17/109,144

(22) Filed: Dec. 2, 2020

(65) Prior Publication Data
US 2022/0172796 A1   Jun. 2, 2022

(51) Int. Cl.
*G11C 29/38*   (2006.01)
*G11C 29/00*   (2006.01)
*H01L 27/108*  (2006.01)

(52) U.S. Cl.
CPC ............ *G11C 29/38* (2013.01); *G11C 29/006* (2013.01); *H01L 27/10805* (2013.01)

(58) Field of Classification Search
None
See application file for complete search history.

(56) References Cited

U.S. PATENT DOCUMENTS

| 7,935,965 B1 * | 5/2011 | Brozek | G03F 7/70466 438/18 |
| 2004/0049722 A1 * | 3/2004 | Matsushita | G11C 29/006 714/724 |
| 2008/0298113 A1 * | 12/2008 | Liu | H01L 45/06 257/E47.001 |
| 2016/0307730 A1 | 10/2016 | Namai et al. | |
| 2017/0040230 A1 | 2/2017 | Yamaguchi et al. | |
| 2019/0080036 A1 * | 3/2019 | Dai | G06F 30/327 |

FOREIGN PATENT DOCUMENTS

| JP | 2004288743 A | * | 10/2004 | ............. H01L 21/66 |
| JP | 2012519391 A2 | * | 8/2012 | ............. H01L 21/66 |
| KR | 100425899 B1 | * | 4/2004 | ............. H01L 21/00 |
| KR | 20100046300 A | * | 5/2010 | ............. H01L 21/27 |

OTHER PUBLICATIONS

Li, "Advanced failure analysis of memory devices"—IEEE—(2011) (Year: 2011).*

* cited by examiner

*Primary Examiner* — April Y Blair
*Assistant Examiner* — Matthew W Wahlin
(74) *Attorney, Agent, or Firm* — JCIPRNET

(57) ABSTRACT

Provided is a failure mode analysis method for a memory device including the following steps. A wafer is scanned by a test system to generate a failure pattern of the wafer, and a failure count of a single-bit in the wafer is obtained by a test program. A single-bit grouping table is defined according to a word-line layout, a bit-line layout, and an active area layout. A core group and a gap group are formed through grouping in at least one process in a self-aligned double patterning process. Failure counts of single-bits in the core group and the gap group are respectively counted to generate core failure data and gap failure data.

10 Claims, 10 Drawing Sheets

FAILURE MODE ANALYSIS METHOD FOR MEMORY DEVICE

BACKGROUND

Technical Field

The disclosure relates to a failure mode analysis method for a semiconductor device. Particularly, the disclosure relates to a failure mode analysis method for a memory device.

Description of Related Art

During production and use of electronic product, losses of function thereof may be referred to as failures. Generally speaking, failures of electronic products may result from a variety of causes. The processes of searching for causes for and mechanisms of the failures of the electronic products and proposing preventive countermeasures for recurrences of the failures may be referred to as failure mode analyses.

Currently, failure mode analysis methods for semiconductor devices are not perfect. Specifically, the existing failure mode analyses in general rely on physical failure analyses (PFA) to confirm failure modes, and then to reflect problems in the processes. However, the PFA not only takes a great amount of manpower and material resources, but is also time-consuming, which further leads to an increase in manufacturing costs and a decrease in yield rates of the processes.

SUMMARY

The disclosure provides a failure mode analysis method for a memory device, which predicts a failure process site before a PFA, thereby effectively shortening time of analysis and improving a yield rate of the process.

The disclosure provides a failure mode analysis method for a memory device, including the following steps. A wafer is scanned by a test system to generate a failure pattern of the wafer, and a failure count of a single-bit in the wafer is obtained by a test program. A single-bit grouping table is defined according to a word-line layout, a bit-line layout, and an active area layout. A core group and a gap group are formed through grouping in at least one process in a self-aligned double patterning (SADP) processes. A failure count of the single-bit in the core group and a failure count of the single-bit in the gap group are respectively counted to generate core failure data and gap failure data.

Based on the foregoing, in the embodiments of the disclosure, the failure count of the single-bit corresponding to a variety of processes in the SADP process is classified to further quantify the failure characteristic and perform a sequential analysis. That is to say, in the embodiments of the disclosure, a failure process site is predicted through statistical means, thereby effectively shortening the time of analysis and improving the yield rate of the process.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
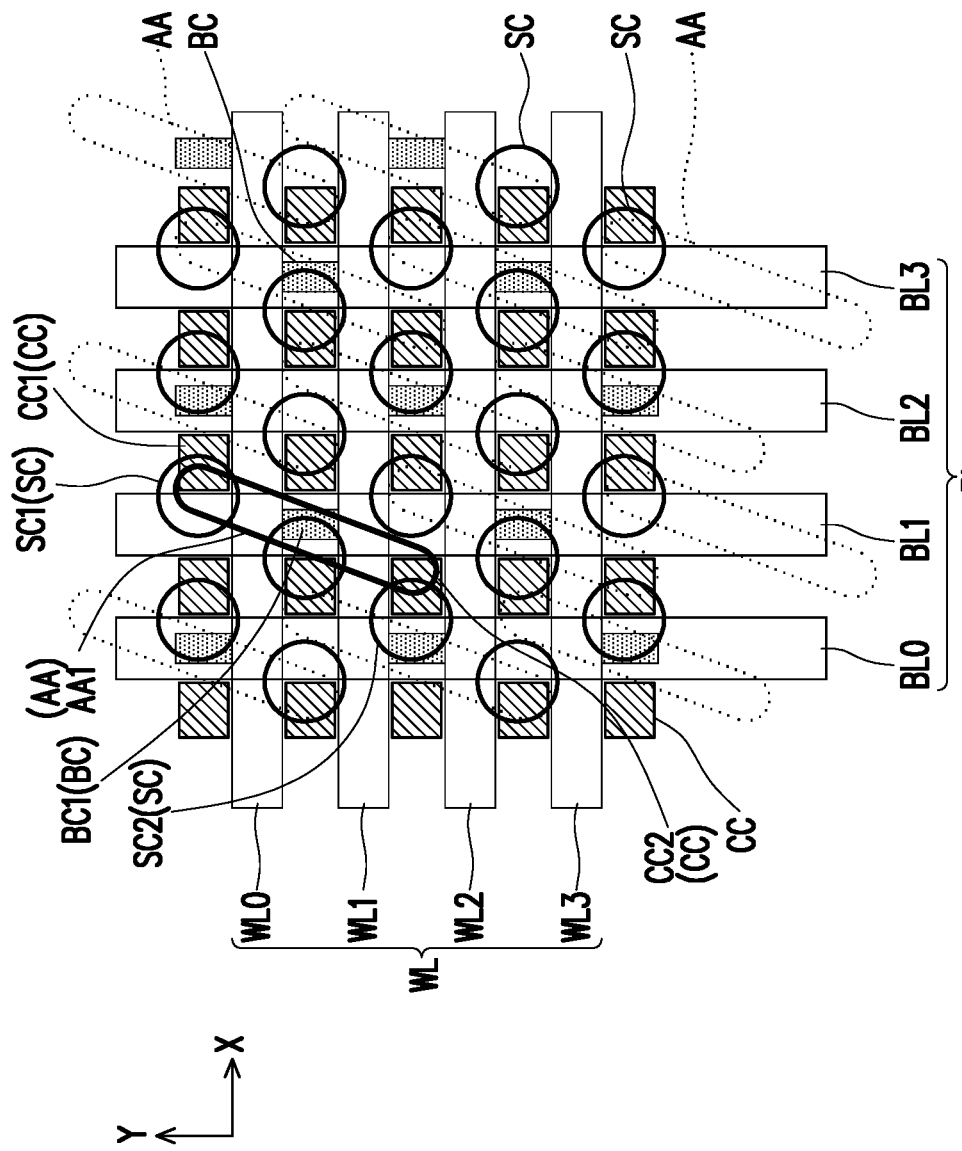
FIG. 1 is a schematic top view of a memory device according to an embodiment of the disclosure.

FIG. 1 is a schematic top view of a memory device according to an embodiment of the disclosure. The memory device in the following embodiments is described taking dynamic random access memory (DRAM) as an example, but the disclosure is not limited thereto.

Referring to FIG. 1, this embodiment provides a memory device including a word-line set WL, a bit-line set BL, a plurality of active areas AA, and a plurality of capacitor contacts CC. Specifically, the word-line set WL includes a plurality of word lines WL0, WL1, WL2, and WL3. The word lines WL0, WL1, WL2, and WL3 extend along an X direction and are alternately arranged along a Y direction. In an embodiment, the word lines WL0, WL1, WL2, and WL3 may be buried word lines, which are formed in a substrate (not shown). The bit-line set BL includes a plurality of bit lines BL0, BL1, BL2, and BL3. The bit lines BL0, BL1, BL2, and BL3 extend along the Y direction and are alternately arranged along the X direction. In an embodiment, the bit lines BL0, BL1, BL2, and BL3 are formed on a substrate (not shown) and each intersect the word lines WL0, WL1, WL2, and WL3. Although FIG. 1 illustrates only four word lines and four bit lines, the disclosure is not limited thereto. In other embodiments, the numbers of word lines and bit lines may be adjusted depending on design requirements.

In an embodiment, the active areas AA are disposed in a strip form. Each of the active areas AA extends across one bit line and two word lines. In addition, at a place where each of the active areas AA overlaps a corresponding bit line, a bit-line contact BC is provided. For example, as shown in FIG. 1, an active area AA1 extends across a bit line BL1 and word lines WL0 and WL1, and at a place where the active area AA1 overlaps the bit line BL1, a bit-line contact BC1 is provided. In this case, the bit line BL1 may be electrically connected to the active area AA1 through the bit-line contact BC1.

In an embodiment, the capacitor contacts CC are respectively disposed in areas defined by the word lines WL0, WL1, WL2, and WL3 and the bit lines BL0, BL1, BL2, and BL3. Capacitors SC are respectively disposed on the capacitor contacts CC. For example, as shown in FIG. 1, the word line WL0 and the bit lines BL1 and BL2 define a position of a capacitor contact CC1, and the word lines WL1 and WL2 and the bit lines BL0 and BL1 define a location of a capacitor contact CC2. From another perspective, the capacitor contacts CC1 and CC2 are respectively disposed on two ends of the active area AA1, the capacitor contact CC1 may be electrically connected to the active area AA1 and the capacitor SC1, and the capacitor contact CC2 may be electrically connected to the active area AA1 and the capacitor SC2. In addition, although the capacitor contact CC is shown as rectangular in FIG. 1, the contact which is actually formed would slightly exhibit a circular form, and dimensions thereof may be designed depending on process requirements.

Notably, the active areas AA, the capacitor contacts CC, and the capacitors SC are disposed offset from each other. For example, as shown in FIG. 1, the active area AA1 partially overlaps the capacitor contacts CC1 and CC2, and the capacitor contacts CC1 and CC2 also partially overlap the capacitors SC1 and SC2. In other words, as long as the capacitor contacts CC can be electrically connected to the active areas AA below and the capacitors SC above, it belongs to the scope of which protection is sought by the disclosure.

Figure 2:
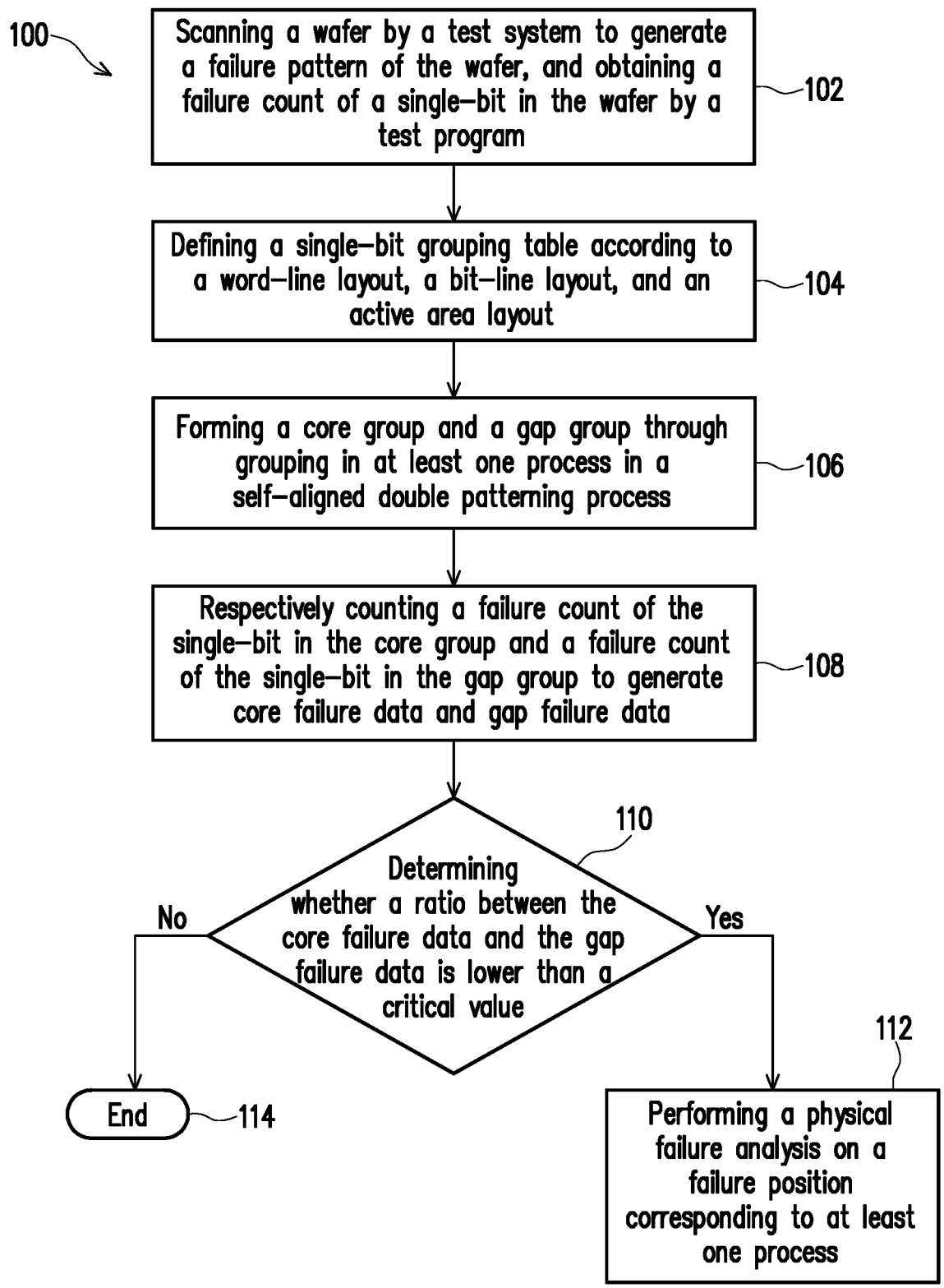
FIG. 2 is a schematic flowchart of a failure mode analysis method according to the first embodiment of the disclosure.
Figure 3:
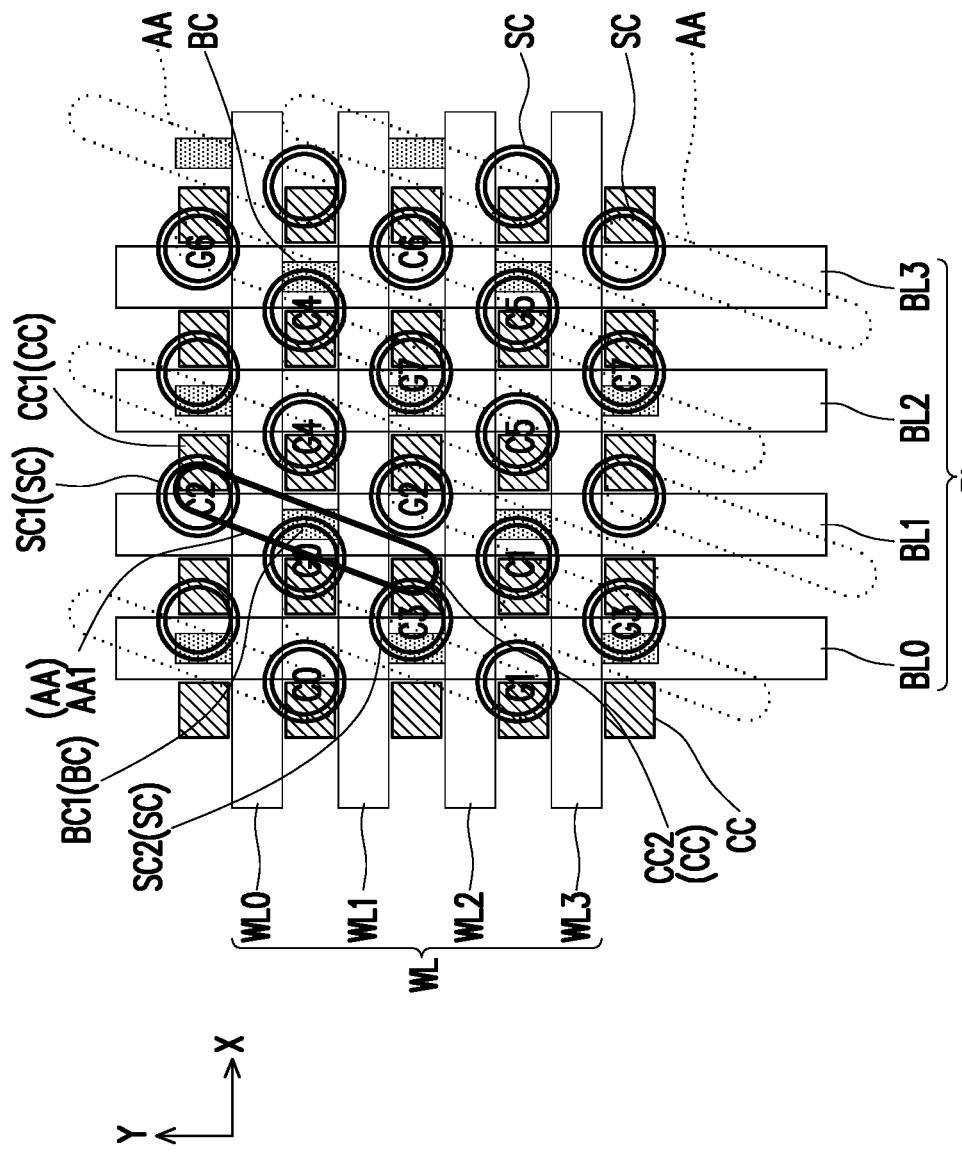
FIG. 3 is a single-bit layout diagram of the memory device in FIG. 1.

FIG. 2 is a schematic flowchart of a failure mode analysis method according to the first embodiment of the disclosure. FIG. 3 is a single-bit layout diagram of the memory device in FIG. 1. FIG. 4A to FIG. 4F are schematic diagrams of grouping of the layout of FIG. 3 according to different processes in the SADP process.

Referring to FIG. 2, the first embodiment of the disclosure provides a failure mode analysis method 100, which includes the following steps. Firstly, step 102 is performed, where a test system is adopted to scan a wafer to generate a failure pattern of the wafer, and a test program is adopted to obtain a failure count of a single-bit in the wafer. In an embodiment, the test system may include, for example, a bit view system, which performs an electrical inspection on a semiconductor device in the wafer to confirm whether the semiconductor device fails to further generate a wafer map. The wafer map provides the failure pattern of the wafer and a location of a failing die in the wafer. In this embodiment, the wafer has a plurality of dies that have already been manufactured, which includes a variety of semiconductor devices (e.g., a memory device, a logic device, an active device, a passive device, etc.) therein.

After scanning the wafer, the test program in the test system may be adopted to obtain the failure count of a single-bit in the wafer. To be specific, each die has a plurality of memory cells, which may be arranged in a memory cell array. In this embodiment, each memory cell can store single-bit data. When the memory cell cannot store or read the single-bit data, it means that the memory cell fails. In an embodiment, the test program may be, for example, an array pattern recognition in C programming language (APRC) test program, which may be adopted to obtain the number of failing memory cells in the wafer.

Then, step 104 is performed, where a single-bit grouping table is defined according to a word-line layout, a bit-line layout, and an active area layout. Specifically, taking the memory device in FIG. 3 as an example, the single-bit grouping table is defined according to the connection relationship between the word lines WL0, WL1, WL2, and WL3, the bit lines BL0, BL1, BL2, and BL3, and the active areas AA, as shown in Table 1 below. To be specific, Table 1 shows sixteen single-bits C0-C7 and G0-G7, which respectively correspond to the capacitors SC (memory cells). For example, in the active area AA1, the bit line BL1 and the word line WL0 control the single-bit data to be stored in the capacitor SC1. Therefore, the bit line BL1 and the word line WL0 in Table 1 correspond to the single-bit C2 that overlaps the capacitor SC1. Similarly, in the active area AA1, the bit line BL1 and the word line WL1 control the single-bit data to be stored in the capacitor SC2. Therefore, the bit line BL1 and the word line WL1 in Table 1 correspond to single-bit C3 that overlaps the capacitor SC2. In addition, since FIG. 3 illustrates only four word lines and four bit lines, Table 1 includes only sixteen single-bits. Nonetheless, the disclosure is not limited thereto. In other embodiments, since the word lines and the bit lines are arranged regularly, the sixteen single-bits in Table 1 may form a unit to be repetitively arranged on a periodical basis.

TABLE 1

|  | BL0 | BL1 | BL2 | BL3 |
| --- | --- | --- | --- | --- |
| WL0 | C0 | C2 | G4 | G6 |
| WL1 | G0 | C3 | C4 | G7 |
| WL2 | G1 | G2 | C5 | C6 |
| WL3 | C1 | G3 | G5 | C7 |

Afterward, step 106 is performed, where a core group and a gap group are formed through grouping in at least one process in the SADP process. Specifically, since the SADP process generates repetitive patterns having different line widths, the core group and the gap group may be formed through grouping in the SADP process. In an embodiment, a core pattern in the core group and a gap pattern in the gap group may have different line widths. Taking the memory device of this embodiment as an example, the SADP process may include a word line process, a bit line process, a capacitor contact process, a capacitor process, an active area process, or a combination thereof. That is to say, the word line, the bit line, the capacitor contact, the capacitor, and the active area among other structures are all formed with the SADP process. In this case, the structures may have core patterns and gap patterns having different line widths. The core patterns and the gap patterns may be grouped into different core groups and gap groups.

Figure 4A:
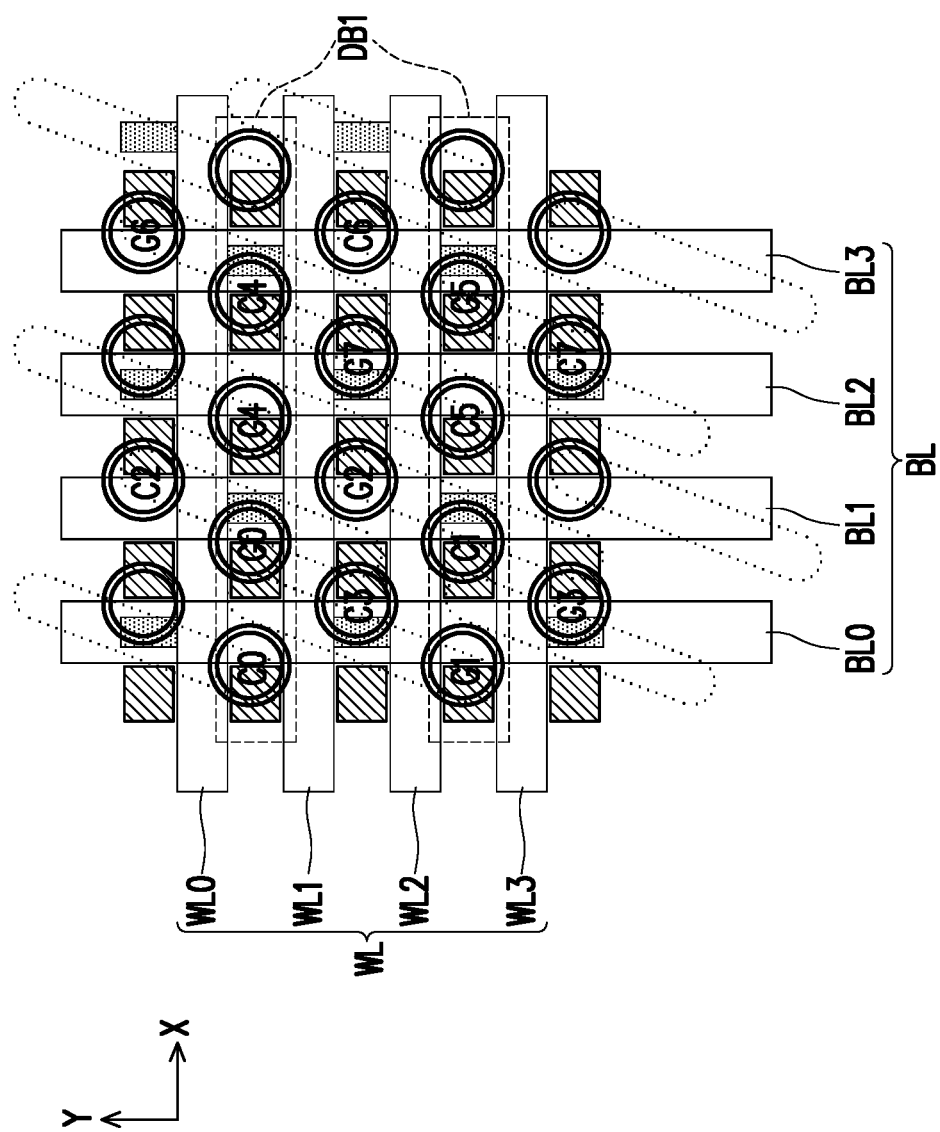
FIG. 4A is a schematic diagram of grouping of the layout of FIG. 3 according to a word line process.
Figure 4B:
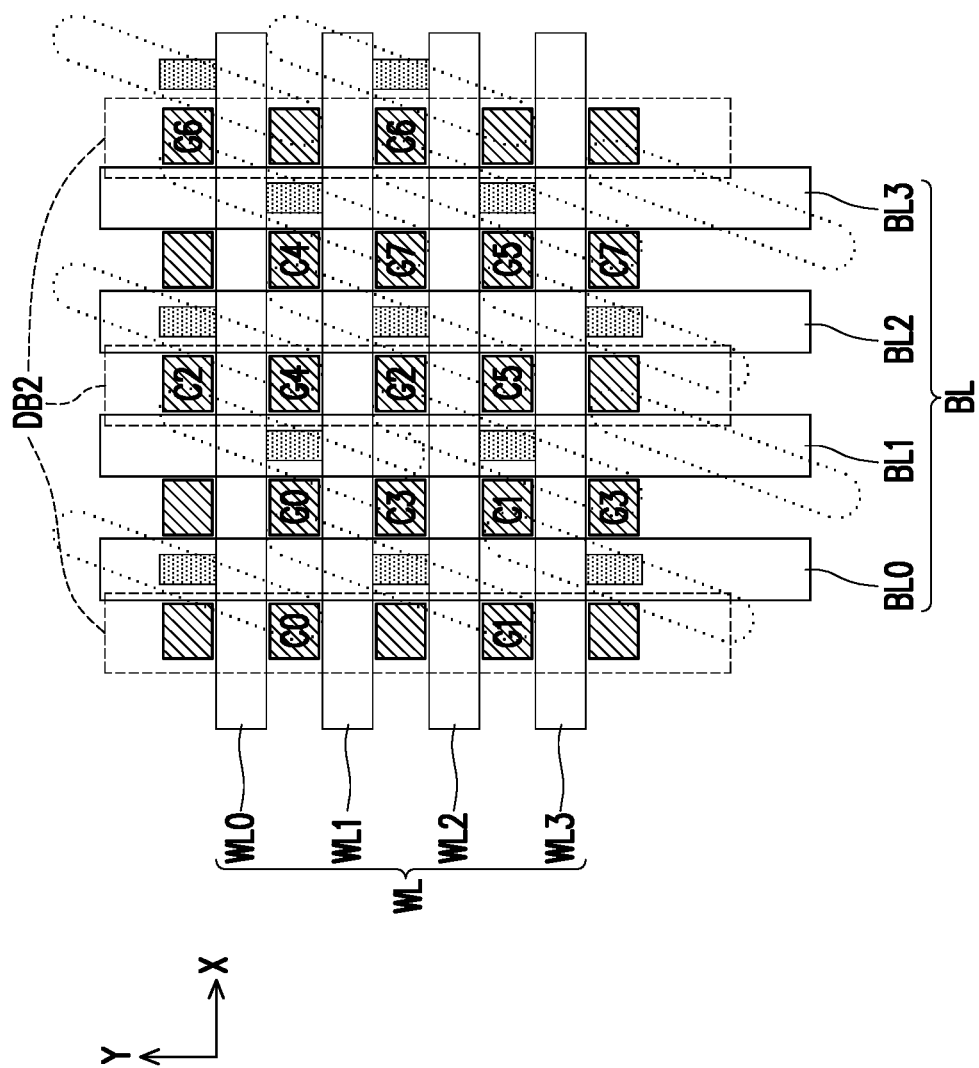
FIG. 4B is a schematic diagram of grouping the layout of FIG. 3 according to a bit line process.
Figure 4C:
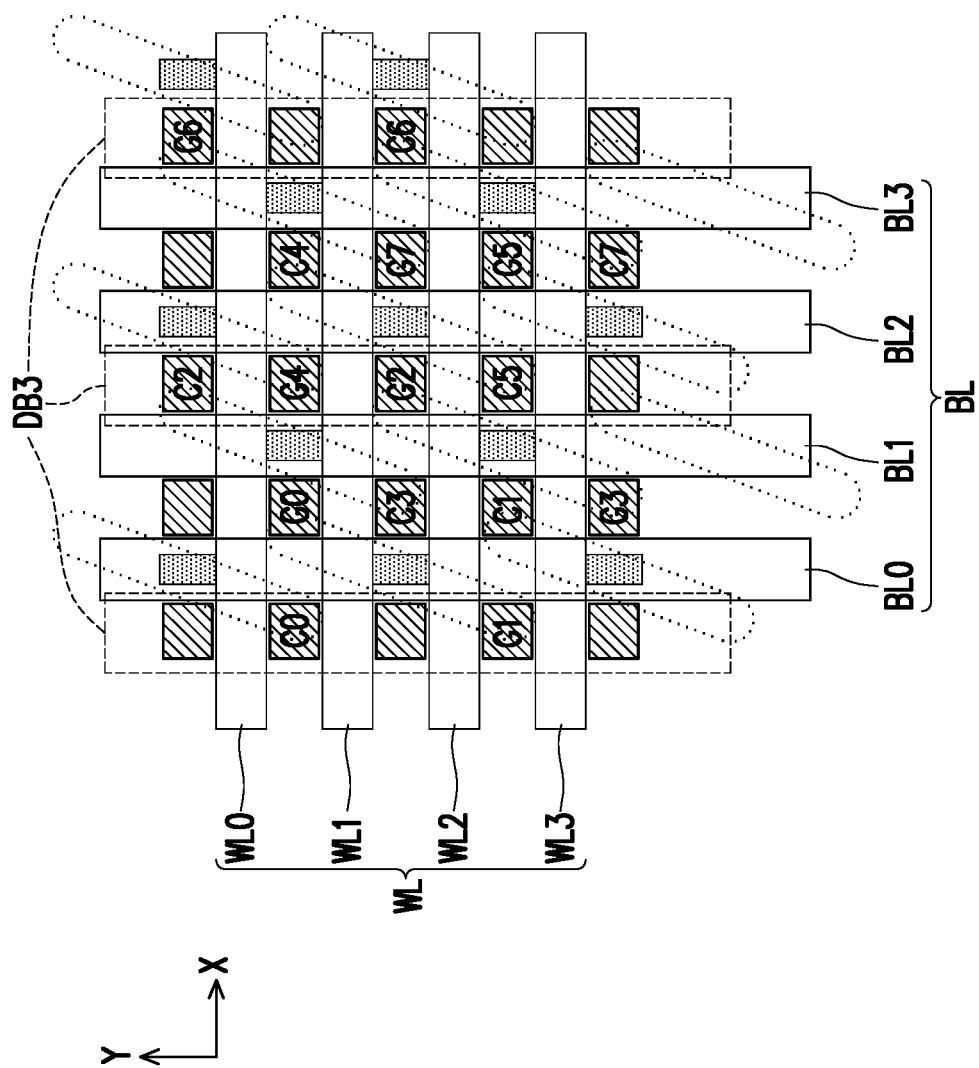
FIG. 4C is a schematic diagram of grouping the layout of FIG. 3 according to a capacitor contact process.
Figure 4D:
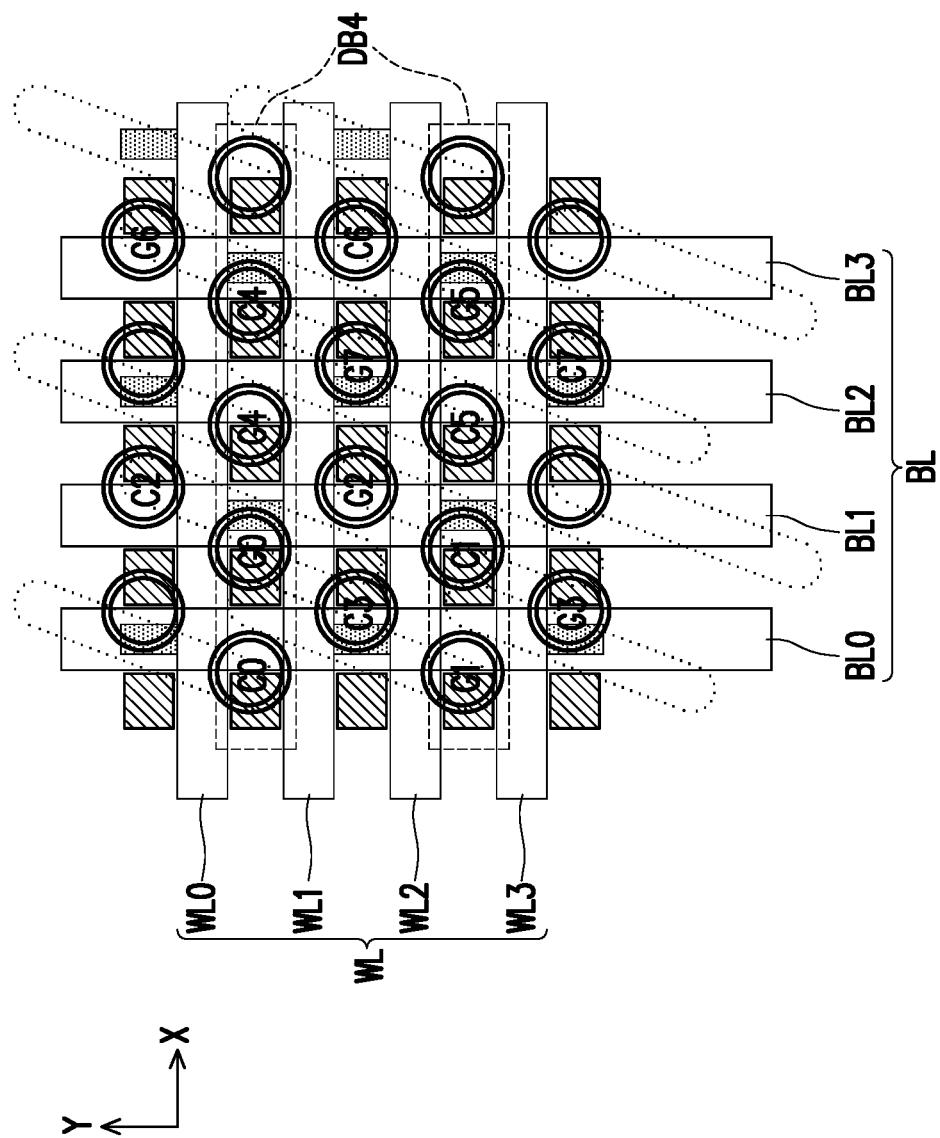
FIG. 4D is a schematic diagram of grouping the layout of FIG. 3 according to a first capacitor process.
Figure 4E:
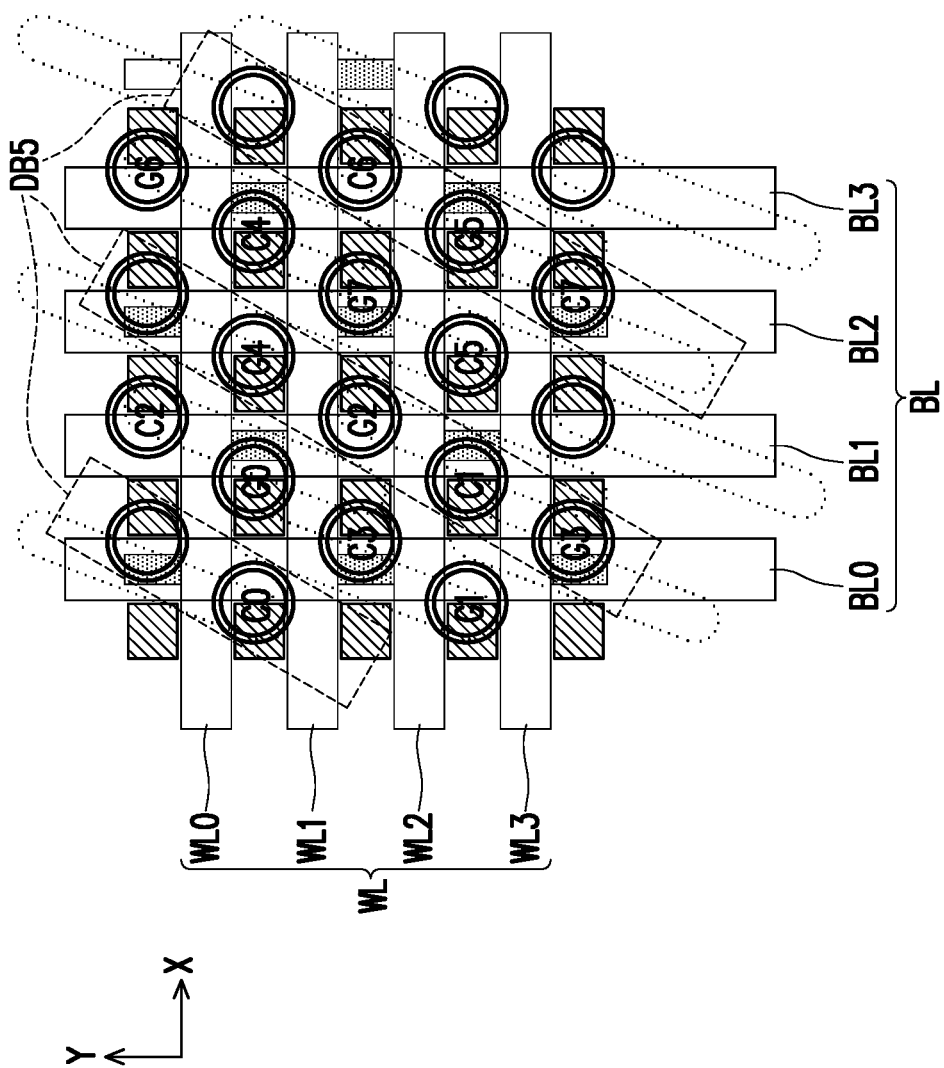
FIG. 4E is a schematic diagram of grouping the layout of FIG. 3 according to a second capacitor process.

For example, FIG. 4A is a schematic diagram of grouping of the layout of FIG. 3 according to a word line process, and dashed line boxes DB1 extends along the direction of the word line set WL. In an embodiment, areas defined by the dashed line boxes DB1 may be classified into a core group, which includes the single-bits C0, G0, G4, C4, G1, C1, C5, and G5. On the other hand, areas not defined by the dashed line boxes DB1 may be classified into a gap group, which includes the single-bits C2, G6, C3, G2, G7, C6, G3, and C7. FIG. 4B is a schematic diagram of grouping of the layout of FIG. 3 according to a bit line process, and the dashed line boxes DB2 extends along the direction of the bit line set BL. In an embodiment, areas defined by the dashed line boxes DB2 may be classified into a core group, which includes the single-bits C0, G1, C2, G4, G2, C5, G6, and C6. On the other hand, areas not defined by the dashed line boxes DB2 may be classified into a gap group, which includes the single-bits G0, C3, C1, G3, C4, G7, G5, and C7. FIG. 4C is a schematic diagram of grouping of the layout of FIG. 3 according to a capacitor contact process, and dashed line boxes DB3 correspond to positions of the capacitor contacts CC and extend along the direction of the bit line set BL. In an embodiment, areas defined by the dashed line boxes DB3 may be classified into a core group, which includes the single-bits C0, G1, C2, G4, G2, C5, G6, and C6. On the other hand, areas not defined by the dashed line boxes DB3 may be classified into a gap group, which includes the single-bits G0, C3, C1, G3, C4, G7, G5, and C7. FIG. 4D is a schematic diagram of grouping of the layout of FIG. 3 according to a first capacitor process (SW), and the dashed line boxes DB4 correspond to positions of the capacitors SC and extend along the direction of the word line set WL. In an embodiment, areas defined by the dashed line boxes DB4 may be classified into a core group, which includes the single-bits C0, G0, G4, C4, G1, C1, C5, and G5. On the other hand, areas not defined by the dashed line boxes DB4 may be classified into a gap group, which includes the single-bits C2, G6, C3, G2, G7, C6, G3, and C7. FIG. 4E is a schematic diagram of grouping of the layout of FIG. 3 according to a second capacitor process (SB), and the dashed line boxes DB5 extend along a direction of the active area AA. In an embodiment, areas defined by the dashed line boxes DB5 may be classified into a core group, which includes the single-bits C0, G4, G2, C1, G3, C6, G5, and C7. On the other hand, areas not defined by the dashed line boxes DB5 may be classified into a gap group, which includes the single-bits C2, G0, C3, G1, G6, C4, G7, and C5.

Afterward, step 108 is performed, where the failure counts of the single-bit in the core group and the gap group are respectively counted to generate core failure data and gap failure data. To be specific, after the APRC test program generates the failure count of the single-bits C0-C7 and G0-G7, the failure count of the single-bit in the core group may be calculated according to the different processes in the SADP process to generate the core failure data. On the other hand, the failure count of the single-bit in the gap group may be calculated according to the different processes in the SADP process to generate the gap failure data. Taking the word line process in FIG. 4A as an example, the core failure data is obtained by adding the failure count of the single-bits C0, G0, G4, C4, G1, C1, C5, and G5 in the core group, and the gap failure data is obtained by adding the failure count of the single-bits C2, G6, C3, G2, G7, C6, G3, and C7 in the gap group. Since different processes have different core failure data and gap failure data, at least 5 core failure data and at least 5 gap failure data may be obtained in this embodiment, corresponding to the different processes in FIG. 4A to FIG. 4E.

Then, step 110 is performed, where it is determined whether a ratio between the core failure data and the gap failure data is lower than a critical value. Since the core failure data may be greater or lower than the gap failure data, a definition of the critical value is a ratio generated from dividing the failure data which is lower (in quantity) by the failure data which is greater (in quantity). In an embodiment, the critical value is 0.5. That is, the core failure data and the gap failure data have a difference of two times. However, the disclosure is not limited thereto. In other embodiments, the critical value may be between 0.01 and 0.5. That is, the core failure data and the gap failure data have a difference of two times to one hundred times. For example, when the ratio between the core failure data and the gap failure data is lower than 0.5, it means that the difference between the core pattern in the core group and the gap pattern in the gap group is excessively large (i.e., greater than two times), and a probability of failure is relatively higher. In contrast, when the difference between the core pattern and the gap pattern is little (i.e., lower than two times), the probability of failure is not high.

When the ratio between the core failure data and the gap failure data is lower than the critical value, it means that the structure related to the SADP process in the memory device may be abnormal. In this case, step 112 is performed, where the PFA is performed on a failure position corresponding to the process. Notably, in this embodiment, the different processes in the SADP process are grouped, which may therefore be sorted according to the ratio between the core failure data and the gap failure data to obtain a structural difference sequence. For example, when a first ratio between first core failure data and first gap failure data in FIG. 4A is much lower than a second ratio between second core failure data and second gap failure data in FIG. 4B, and the first ratio is lower than 0.5 (i.e., the critical value), it means that a difference of the word line is greater than a difference of the bit line. In this case, the PFA may be performed on a position of the word line to effectively determine a failure characteristic and reflect a problem in the process.

On the other hand, when the ratio between the core failure data and the gap failure data is greater than the critical value, it means that the structure related to the SADP process in the memory device is normal. In this case, step 114 is performed, where the failure mode analysis method 100 is ended.

Figure 4F:
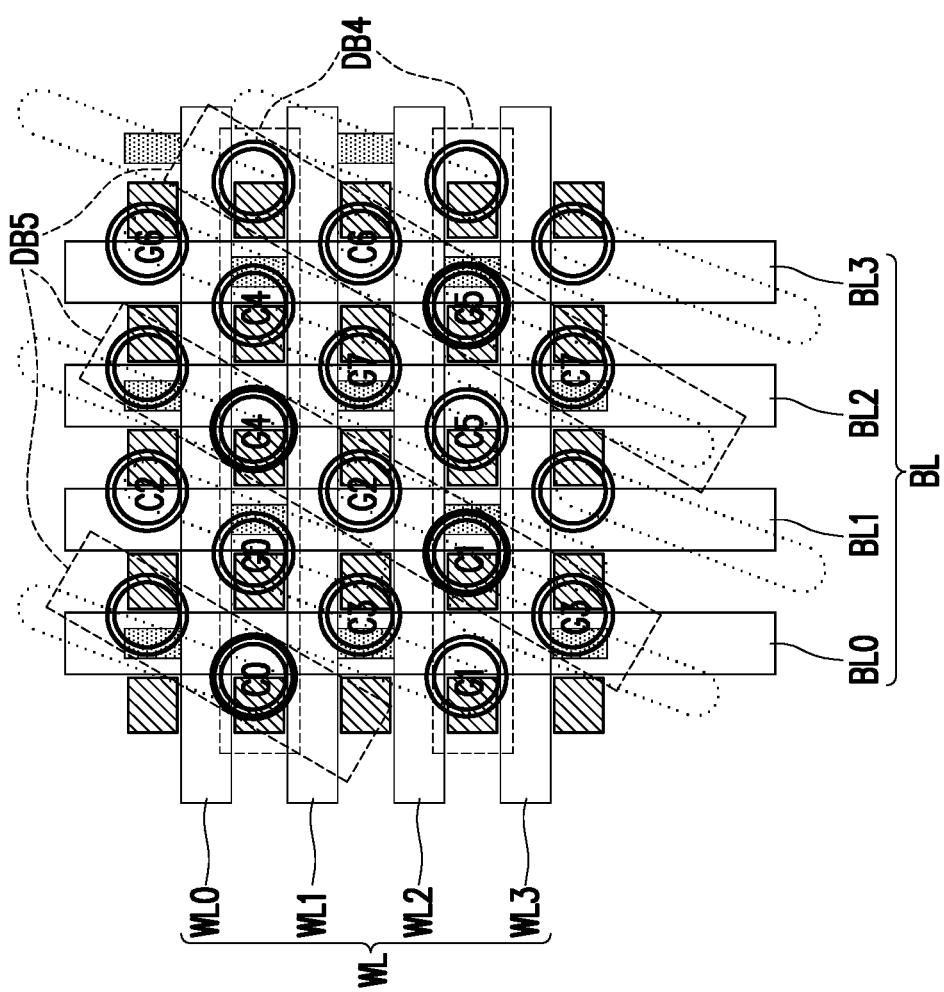
FIG. 4F is a schematic diagram of grouping of the layout of FIG. 3 according to a first capacitor process and a second capacitor process.

Furthermore, in an alternative embodiment, at least two processes may be combined to obtain a more accurate failure position. Specifically, FIG. 4F is a schematic diagram of grouping of the layout of FIG. 3 according to the first capacitor process and the second capacitor process, and the dashed line boxes DB4 and DB5 respectively represent a first core group and a second core group. On the other hand, areas not defined by the dashed line boxes DB4 and DB5 are classified into a first gap group and a second gap group. When step 108 in FIG. 2 is performed, a failure count of the overlapping single-bit (e.g., C0, C1, G4, G5) between the first core group and the second core group may be counted to generate first failure data, a failure count of the overlapping single-bit (e.g., G0, G1, C4, C5) between the first core group and the first gap group may be counted to generate second failure data, a failure count of the overlapping single-bit (e.g., G2, G3, C6, C7) between the first gap group and the second core group may be counted to generate third failure data, and a failure count of the overlapping single-bit (e.g., C2, C3, G6, G7) between the first gap group and the second gap group may be counted to generate fourth failure data. Next, step 110 in FIG. 2 is performed, where it is determined whether a ratio between any two of the first failure data, the second failure data, the third failure data, and the fourth failure data is lower than the critical value. When the ratio between any two of the first failure data, the second failure data, the third failure data, and the fourth failure data is lower than the critical value, step 112 is performed, where the PFA is performed on the failure position corresponding to the process.

For example, when the ratio between the first failure data and the second failure data is lower than 0.5 (e.g., the critical value), it means that the structures of the capacitors SC at positions of the single-bits C0, C1, G4, and G5 are abnormal. In this case, the PFA may be performed on the capacitors SC at the positions of the single-bits C0, C1, G4, and G5. Therefore, this embodiment can more effectively focus on specific failure characteristics, which shortens the time of analysis, reflects the problem in the process, and thereby improves the yield rate of the process.

Figure 5:
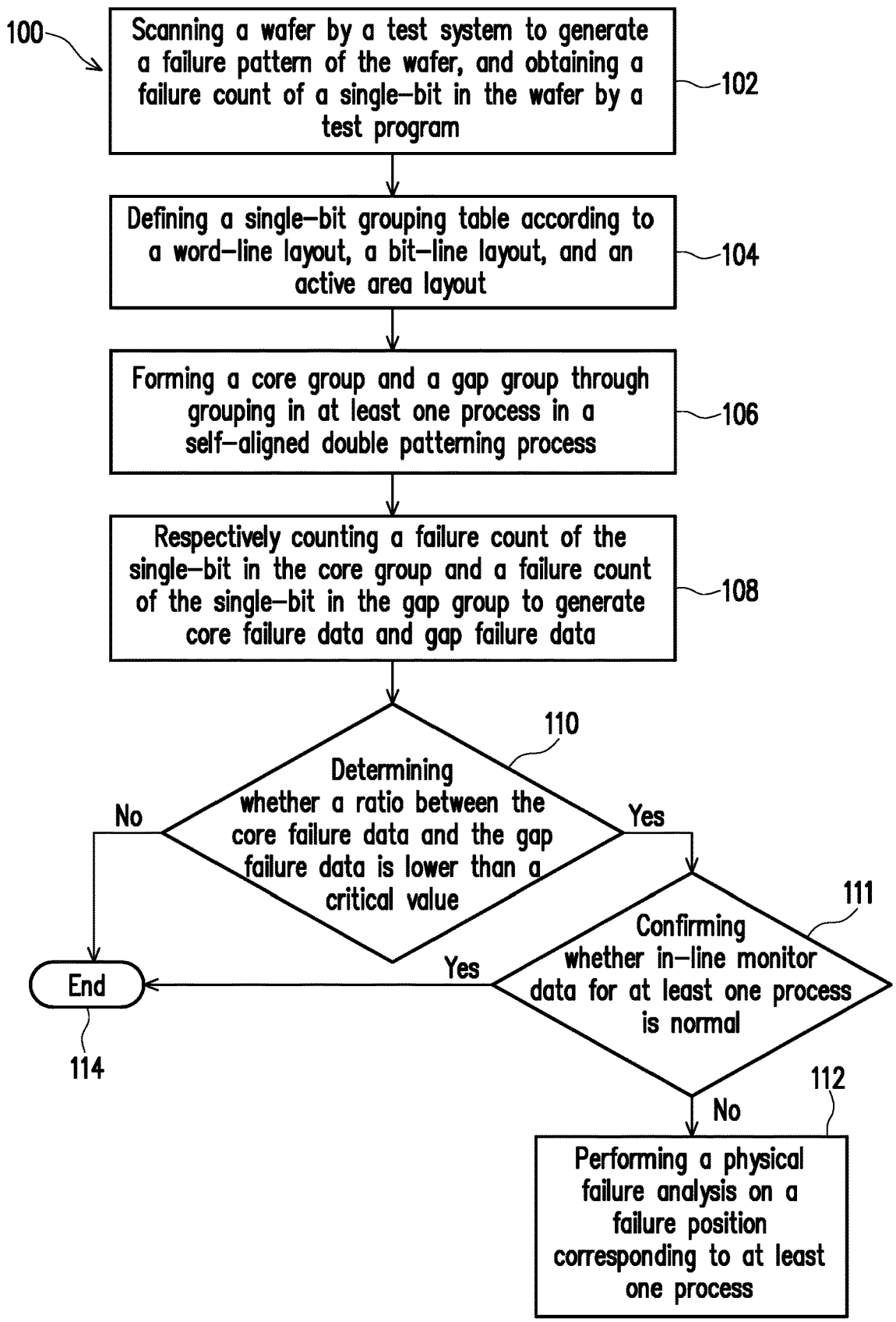
FIG. 5 is a schematic flowchart of a failure mode analysis method according to the second embodiment of the disclosure.

FIG. 5 is a schematic flowchart of a failure mode analysis method according to the second embodiment of the disclosure.

A failure mode analysis method 200 in the second embodiment of the disclosure is generally similar to the failure mode analysis method 100 in the first embodiment of the disclosure. Since steps 102, 104, 106, 108, and 110 have been described in detail in the abovementioned embodiment, the same will not be repeatedly described herein. A difference between the two lies in that the failure mode analysis method 200 in the second embodiment further includes step 111. That is to say, after it is determined whether the ratio between the core failure data and the gap failure data is lower than the critical value (i.e., step 110), when the ratio between the core failure data and the gap failure data is lower than the critical value, it means that the structure related to the SADP process in the memory device may be abnormal. In this case, step 111 is performed, where it is confirmed whether in-line monitor data of the process is normal. In an embodiment, the in-line monitor data of the process include a critical dimension (CD) of the capacitor, a critical dimension of the capacitor contact, a width of the word line, a width of the bit line, a width of the active area, or a combination thereof. When the in-line monitor data of the process is abnormal, step 112 is performed, where the PFA is performed on the failure position corresponding to the process. On the other hand, when the in-line monitor data of the process is normal, step 114 is performed, where the failure mode analysis method 200 is ended.

In summary of the foregoing, in this embodiment, the in-line monitor data of the SADP process may be confirmed before the PFA to predict the failure process site in advance, thereby effectively shortening the time of analysis and accurately reflecting the problem in the process. In this case, time for process improvement can be shortened to reduce process costs and wafer loss, and thereby effectively improve the yield rate of the process. In addition, in this embodiment, the problem in the SADP process can be presented through the data for the failure count of the single-bit. In other words, the data may be related to a process parameter or a process defect. Therefore, the failure mode analysis methods 100 and 200 in the disclosure can adopt artificial intelligence or big data to automatically analyze and predict the failure process site in the SADP process to effectively shorten the time of analysis, and thereby increase the production capacity and the yield rate of the process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A failure mode analysis method for a memory device, comprising:
   scanning a wafer by a test system to generate a failure pattern of the wafer, and obtaining a failure count of a plurality of bits in the wafer by a test program;
   defining a grouping table of the plurality of bits according to a word-line layout, a bit-line layout, and an active area layout;
   grouping the plurality of bits into a core group and a gap group according to at least one process in a self-aligned double patterning process, wherein the core group has a first plurality of bits and the gap group has a second plurality of bits different from the first plurality of bits; and
   respectively counting a failure count of the first plurality of bits in the core group and a failure count of the second plurality in the gap group to generate a core failure data and a gap failure data.

2. The failure mode analysis method for the memory device as described in claim 1, further comprising: after generating the core failure data and the gap failure data, determining a difference between a core pattern and a gap pattern from whether a ratio of the core failure data to the gap failure data is less than a critical value, wherein the critical value is 0.5.

3. The failure mode analysis method for the memory device as described in claim 2, further comprising confirming whether in-line monitor data for the at least one process is normal when the ratio between the core failure data and the gap failure data is lower than the critical value.

4. The failure mode analysis method for the memory device as described in claim 2, further comprising performing a physical failure analysis on a failure position corresponding to the at least one process when the ratio between the core failure data and the gap failure data is lower than the critical value.

5. The failure mode analysis method for the memory device as described in claim 1, wherein the at least one process comprises a word line process, a bit line process, a capacitor contact process, a capacitor process, an active area process, or a combination thereof.

6. The failure mode analysis method for the memory device as described in claim 1, wherein the at least one process comprises a first process and a second process, the core group comprises a first core group corresponding to the first process and a second core group corresponding to the second process, and the gap group comprises a first gap group corresponding to the first process and a second gap group corresponding to the second process.

7. The failure mode analysis method for the memory device as described in claim 6, further comprising:
   counting a failure count of the plurality of bits where the first core group and the second core group are overlapped to generate a first failure data;
   counting a failure count of the plurality of bits where the first core group and the first gap group are overlapped to generate a second failure data;
   counting a failure count of the plurality of bits where the first gap group and the second core group are overlapped to generate a third failure data; and
   counting a failure count of the plurality of bits where the first gap group and the second gap group are overlapped to generate a fourth failure data.

8. The failure mode analysis method for the memory device as described in claim 7, further comprising determining whether a ratio between any two of the first failure data, the second failure data, the third failure data, and the fourth failure data is lower than a critical value, wherein the critical value is 0.5.

9. The failure mode analysis method for the memory device as described in claim 1, wherein the memory device comprises dynamic random access memory.

10. The failure mode analysis method for the memory device as described in claim 9, wherein the plurality of bits single bit corresponds to a capacitor in the dynamic random access memory.

* * * * *